United States Patent [19]
Urabe

[11] Patent Number: 5,559,047
[45] Date of Patent: Sep. 24, 1996

[54] METHOD OF RELIABLY MANUFACTURING A SEMICONDUCTOR DEVICE HAVING A TITANIUM SILICIDE NITRIDE

[75] Inventor: Kouji Urabe, Tokyo, Japan

[73] Assignee: NEC Corporation, Japan

[21] Appl. No.: 496,370

[22] Filed: Jun. 29, 1995

[30] Foreign Application Priority Data

Jun. 29, 1994 [JP] Japan ................................ 6-148068

[51] Int. Cl.⁶ .................................................. H01L 21/283
[52] U.S. Cl. ............................ 437/41; 437/790; 437/792; 437/200
[58] Field of Search .................. 437/41 GS, 41 SM, 437/40 GS, 200, 790, 792, 795; 257/377, 383, 413, 751, 755

[56] References Cited

U.S. PATENT DOCUMENTS

| | | | |
|---|---|---|---|
| 4,760,369 | 7/1988 | Tiku | 338/308 |
| 4,897,368 | 1/1990 | Kobushi et al. | 437/200 |
| 5,066,615 | 11/1991 | Brady et al. | 437/229 |
| 5,164,333 | 11/1992 | Schwalke et al. | 437/200 |
| 5,252,518 | 10/1993 | Sandhu et al. | 437/200 |
| 5,364,803 | 11/1994 | Lur et al. | 437/40 |

FOREIGN PATENT DOCUMENTS

| | | | |
|---|---|---|---|
| 57-58364 | 4/1982 | Japan | 437/200 |
| 5-102073 | 4/1993 | Japan | 437/200 |

Primary Examiner—T. N. Quach
Attorney, Agent, or Firm—Hayes, Soloway, Hennessey, Grossman & Hage, P.C.

[57] ABSTRACT

In manufacturing a semiconductor device, an insulator layer is formed on a semiconductor substrate. A polycrystal silicon layer is formed on an upper insulator surface of the insulator layer to have a first upper surface leaving a surrounding area of the upper insulator surface. The polycrystal silicon layer has impurities which are doped in the polycrystal silicon layer. A titanium silicide nitride layer is formed on the first upper surface. A titanium silicide layer is formed on the titanium silicide nitride layer.

3 Claims, 5 Drawing Sheets

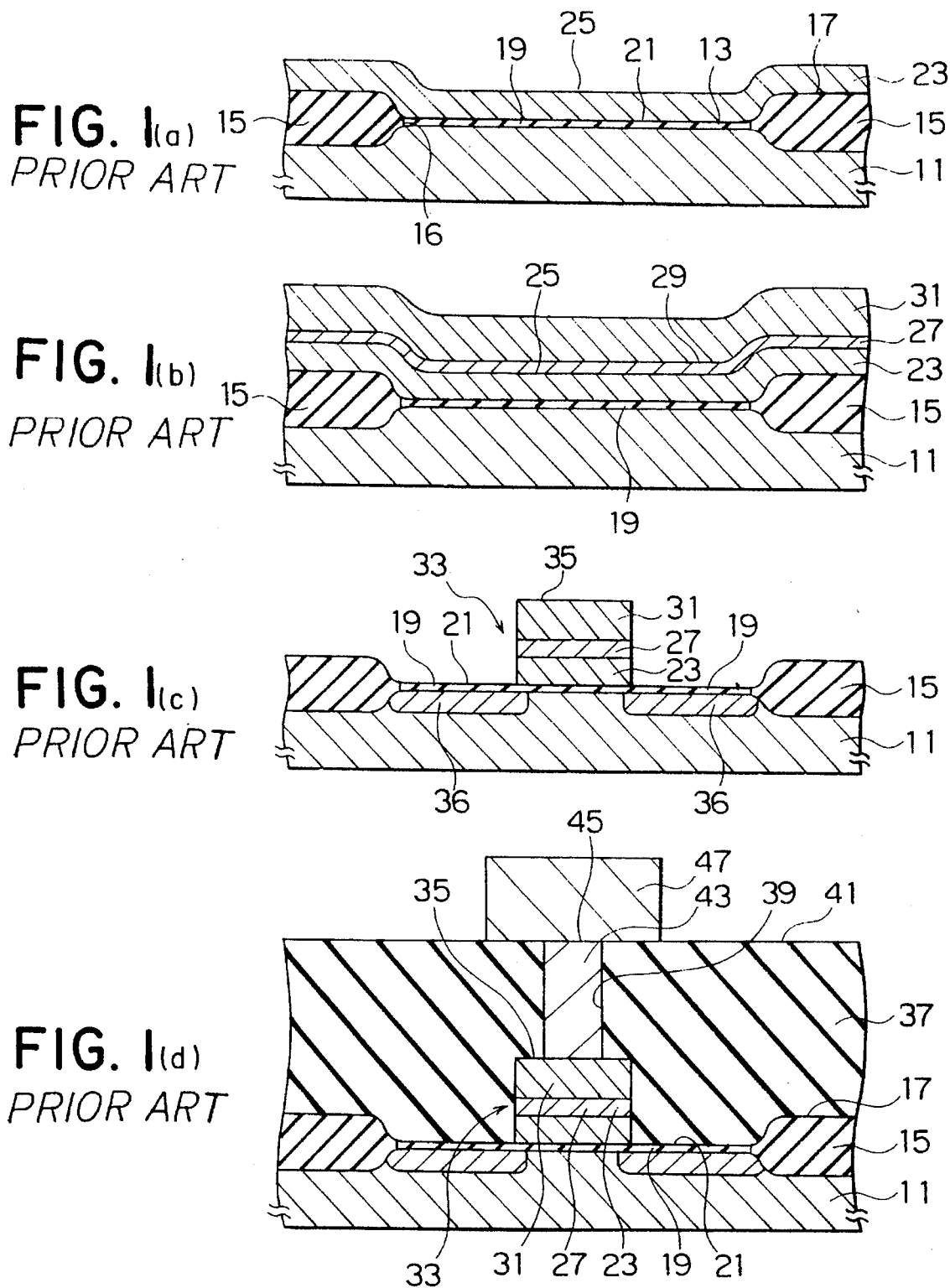
FIG. I(a) PRIOR ART
FIG. I(b) PRIOR ART
FIG. I(c) PRIOR ART
FIG. I(d) PRIOR ART

METHOD OF RELIABLY MANUFACTURING A SEMICONDUCTOR DEVICE HAVING A TITANIUM SILICIDE NITRIDE

BACKGROUND OF THE INVENTION

1. Field of the Invention

This invention relates to a method of manufacturing a semiconductor device.

2. Brief Description of Related Art

In the manner which will be described more in detail, a first method of manufacturing a semiconductor device comprises steps of preparing a semiconductor substrate to have a principal surface; forming a first insulator layer on the principal surface having a first recessed surface which defines a first hole exposing a first predetermined area of the principal surface; forming a second insulator layer on the first predetermined area of the principal surface; forming a polycrystal silicon layer on the first and the second insulator layers to have phosphorus particles; forming a titanium nitride layer on the first polycrystal silicon layer by using a sputtering method which uses titanium; and forming a titanium silicide layer on the titanium nitride layer by using a sputtering method which uses titanium silicide alloy.

In the method of manufacturing the semiconductor device, inasmuch as the titanium silicide layer is corroded when the first contact hole is formed in the second insulator layer formed on the titanium silicide layer by using etching, it is difficult to reliably manufacture the semiconductor device. Also, in the method of manufacturing the semiconductor device, it is required to use both of titanium and titanium silicide alloy.

In the manner which will be described more in detail, a second method of manufacturing a semiconductor device comprises steps of preparing a semiconductor substrate having a principal surface; forming a first insulator layer on a predetermined area of the principal surface having a first upper insulator surface; forming an impurity diffusion layer in a surface part of the semiconductor substrate having impurities in the impurity diffusion layer; forming a second insulator layer on the first upper insulator surface and an impurity diffusion surface in the impurity diffusion layer; forming, in the first and the second insulator layers, a recessed surface which defines a contact hole exposing a predetermined area of the impurity diffusion surface; forming a titanium silicide layer on the predetermined area of the impurity diffusion surface and the recessed surface by using a sputtering method which uses titanium silicide alloy; and forming a titanium nitride layer on the titanium silicide layer by using a sputtering method which uses titanium.

In the method of manufacturing the semiconductor device, inasmuch as the titanium nitride layer is easily oxidized, it is difficult to reliably manufacture the semiconductor device. Also, in the method of manufacturing the semiconductor device, it is required to use both titanium and titanium silicide alloy.

SUMMARY OF THE INVENTION

It is therefore an object of the present invention to provide a method of reliably manufacturing a semiconductor device.

It is another object of this invention to provide a method of manufacturing a semiconductor device that requires only titanium silicide alloy.

Other objects of this invention will become clear as the description proceeds.

According to an aspect of this invention, there is provided a method of manufacturing a semiconductor device that comprises the steps of: preparing a semiconductor substrate having a principal surface; forming an insulator layer on the principal surface to have an upper insulator surface; forming a polycrystal silicon layer on the upper insulator surface having a first upper surface leaving a surrounding area of the upper insulator surface, the polycrystal silicon layer having impurities which are doped in the polycrystal silicon layer; forming a titanium silicide nitride layer on the first upper surface having a second upper surface; and forming a titanium silicide layer on the second upper surface.

According to another aspect of this invention, there is provided a method of manufacturing a semiconductor device that comprises the steps of:, preparing a semiconductor substrate having a principal surface; forming an insulator layer on the principal surface having an upper insulator surface; forming a polycrystal silicon layer on the upper insulator surface having a first upper surface leaving a surrounding area of the upper insulator surface, the polycrystal silicon layer having impurities which are doped in the polycrystal silicon layer forming a first titanium silicide nitride layer on the first upper surface having a second upper surface; forming a titanium silicide layer on the second upper surface to have a third upper surface; and forming a second titanium silicide nitride layer on the third surface.

According to still another aspect of this invention, there is provided a method of manufacturing a semiconductor device that comprises the steps preparing a semiconductor substrate having a principal surface; forming a first insulator layer on the principal surface having a first upper insulator surface; forming an impurity diffusion layer in a surface part of the semiconductor substrate having impurities in the impurity diffusion layer which has an impurity diffusion surface; forming a second insulator layer on the first upper insulator surface to have a second upper insulator surface; forming, in the first and the second insulator layers, a recessed surface which defines a contact hole exposing a predetermined area of the impurity diffusion surface; forming a titanium silicide layer on the predetermined area and the recessed surface having a first upper surface; and forming a titanium silicide nitride layer on the first upper surface.

BRIEF DESCRIPTION OF THE DRAWING

FIGS. 1(a) to 1(d) are schematic vertical sectional views for explaining a first conventional method of manufacturing a semiconductor device;

DESCRIPTION OF THE PREFERRED EMBODIMENTS

Figure 2A:
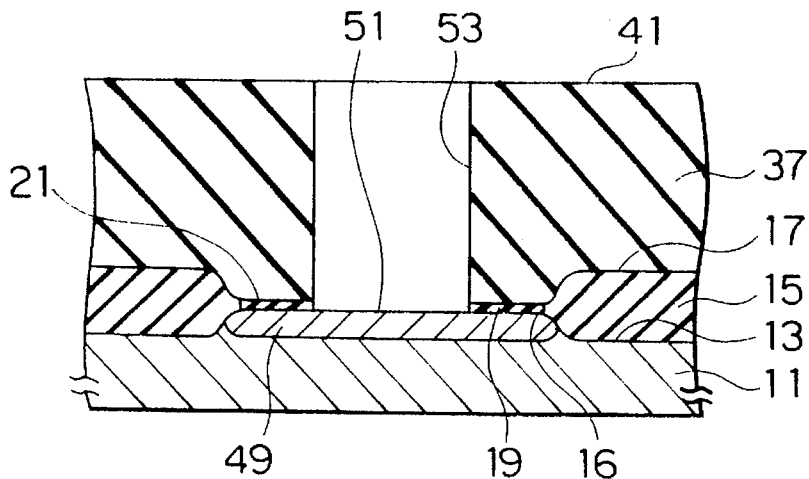
FIGS. 2(a) to 2(c) are schematic vertical sectional views for explaining a second conventional method of manufacturing a semiconductor device.

Referring to FIGS. 1(a) to (d), a first conventional method of manufacturing a semiconductor device will first be described for a better understanding of this invention.

In FIG. 1(a), a semiconductor substrate 11 is prepared in the known manner to have a principal surface 13. The semiconductor substrate 11 is made of P-type silicon. A first insulator layer 15 is formed on the principal surface 13 and has a first recessed surface 16 which defines a first hole exposing a first predetermined area of the principal surface 13. The first insulator layer 15 is made of silicon dioxide. The first insulator layer 15 has a first upper insulator surface 17 and a thickness of 500 nm.

A second insulator layer 19 is formed on the first predetermined area of the principal surface 13. The second insulator layer 19 is made of silicon dioxide. The second insulator layer 19 has a second upper insulator surface 21 and a thickness of 8 nm. A polycrystal silicon layer 23 is formed on the first and the second upper insulator surfaces 17 and 21 to have phosphorus particles which are doped in the polycrystal silicon layer 23. The polycrystal silicon layer 23 has a first upper surface 25 and a thickness of 50 nm.

In FIG. 1(b), a titanium nitride layer 27 is formed on the first upper surface 25 by using a sputtering method which uses titanium. The titanium nitride layer 27 has a second upper surface 29 and a thickness of 50 nm. A titanium silicide layer 31 was formed on the second upper surface 29 by using a sputtering method which uses titanium silicide alloy. The titanium silicide layer 31 has a thickness of 100 nm.

In FIG. 1(c), a gate electrode 33 was formed on the second insulator surface 21 having a third upper surface 35 leaving a surrounding area of the second insulator surface 21 by using photo-lithography and dry-etching. The gate electrode 33 has the polycrystal silicon layer 23, the titanium nitride layer 27, and the titanium silicide layer 31. The titanium nitride layer 27 serves to prevent diffusion of phosphorus particles between the polycrystal silicon layer 23 and the titanium silicide layer 31. The titanium silicide layer 31 serves to lower resistance of the gate electrode 33. An impurity diffusion layer 36 is formed in a surface part of the semiconductor substrate 11 by injecting ions.

In FIG. 1(d), a third insulator layer 37 is formed on the first and the second upper insulator surfaces 17 and 21 and the third upper surface 35 of the gate electrode 33 and has a second recessed surface 39 which defines a first contact hole exposing a second predetermined area of the third upper surface 35. The third insulator layer 37 has a third upper insulator surface 41. The first contact hole is formed by etching. A tungsten plug 43 is formed on the second predetermined area of the third upper surface 35. Namely, the tungsten plug 43 was formed in the first contact hole. The tungsten plug 43 has an upper plug surface 45. An upper line conductor 47 is formed on the upper plug surface 45 and a part of the third upper insulator surface 41.

In the method of manufacturing the semiconductor device, the titanium silicide layer 31 of the gate electrode 33 is corroded when the first contact hole is formed in the third insulator layer 37 by etching, it is difficult to reliably manufacture the semiconductor device. Also, in the method of manufacturing the semiconductor device, it is required to use both titanium and titanium silicide alloy.

Figure 2B:
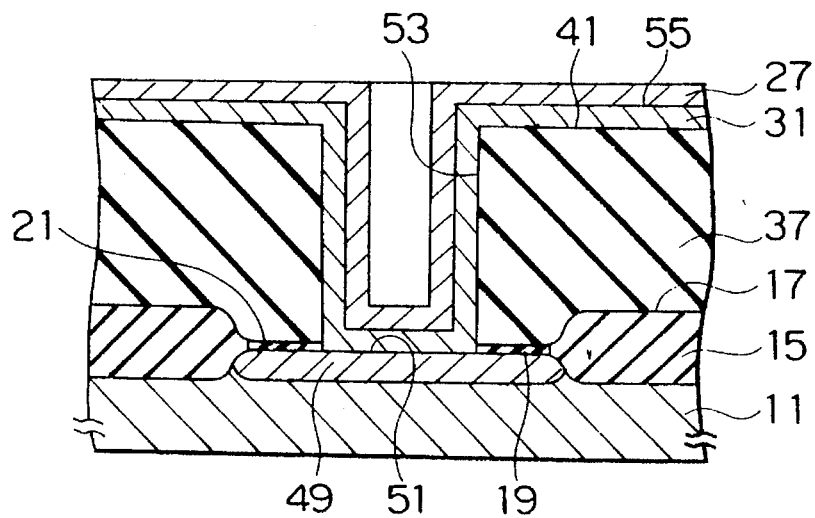
Figure 2C:
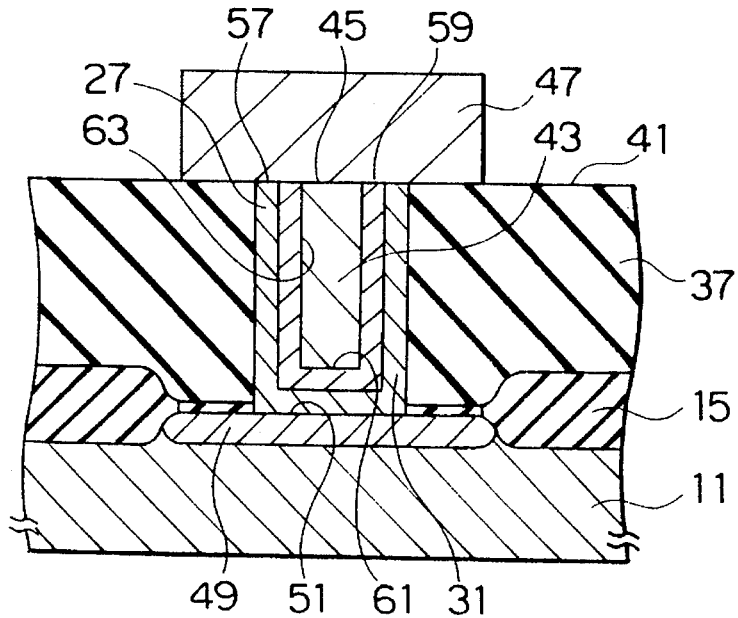

Referring to FIGS. 2(a) to (c), a second conventional method of manufacturing a semiconductor device will be described for a better understanding of this invention. Similar parts are designated by like reference numerals.

In FIG. 2(a), the semiconductor substrate 11 is prepared in the known manner to have the principal surface 13. The first insulator layer 15 is formed on the principal surface 13 having the first recessed surface 16 which defines the first hole exposing the first predetermined area of the principal surface 13. The first insulator layer 15 has the first upper surface 17. The second insulator layer 19 is formed on the first predetermined area of the principal surface 13. The second insulator layer 19 has the second upper insulator surface 21.

An impurity diffusion layer 49 is formed in a surface part of the semiconductor substrate 11 having impurities in the impurity diffusion layer 49. The impurity diffusion layer 49 has an impurity diffusion surface 51. The third insulator layer 37 is formed on the first and the second upper insulator surfaces 17 and 21 and the impurity diffusion surface 51. A second recessed surface 53 is formed in the second and the third insulator layers 19 and 37 to define a second contact hole exposing the second predetermined area of the impurity diffusion surface 51.

In FIG. 2(b), the titanium silicide layer 31 is formed on the second predetermined area of the impurity diffusion surface 51, the second recessed surface 53, and the third upper insulator surface 41 by using the sputtering method which uses titanium silicide alloy. The titanium silicide layer 31 has an upper surface 55. The titanium nitride layer 27 is formed on the upper surface 55 of the titanium silicide layer 31 by using the sputtering method which uses titanium.

In FIG. 2(c), parts of the titanium silicide layer 31 and the titanium nitride layer 27 are taken away from the third upper insulator surface 41 so that the titanium silicide layer 31 and the titanium nitride layer 27 have first and second upper end surfaces 57 and 59. The titanium nitride layer 27 has a bottom surface 61 and a side surface 63 which define a third contact hole. The tungsten plug 43 is formed on the bottom and the side surfaces 63 and 65, namely, in the third contact hole. The tungsten plug 43 has the upper plug surface 45. The line conductor 47 is formed on the upper plug surface 45, the first and the second upper end surfaces 57 and 59 of the titanium silicide layer 27 and the titanium nitride layer 31, and a part of the third upper insulator surface 41.

In the method of manufacturing the semiconductor device, inasmuch as the titanium nitride layer 31 is easily oxidized, it is difficult to reliably manufacture the semiconductor device. Also, in the method of manufacturing the semiconductor device, it is required to use both titanium and titanium silicide alloy.

Referring to FIGS. 3(a) to (d), the description will proceed to a method of manufacturing a semiconductor device according to a first embodiment of this invention. Similar parts are designated by like reference numerals.

Figure 3A:
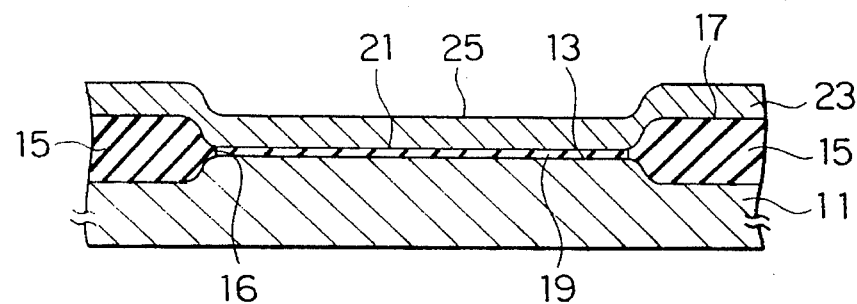
FIGS. 3(a) to 3(d) are schematic vertical sectional views for explaining a method of manufacturing a semiconductor device according to a first embodiment of this invention.

In FIG. 3(a), the semiconductor substrate 11 is prepared in the known manner having the principal surface 13. The first insulator layer 15 is formed on the principal surface 13 having the first recessed surface 16 which defines the first hole exposing the first predetermined area of the principal surface 13. The first insulator layer 15 has the first upper insulator surface 17.

The second insulator layer 19 is formed on the predetermined area of the principal surface 13. The second insulator layer 19 has the second upper insulator surface 21. The polycrystal silicon layer 23 is formed on the first and the second upper insulator surfaces 17 and 21 having phosphorus particles which are doped in the polycrystal silicon layer 23. The polycrystal silicon layer 23 has the first upper surface 25.

Figure 3B:
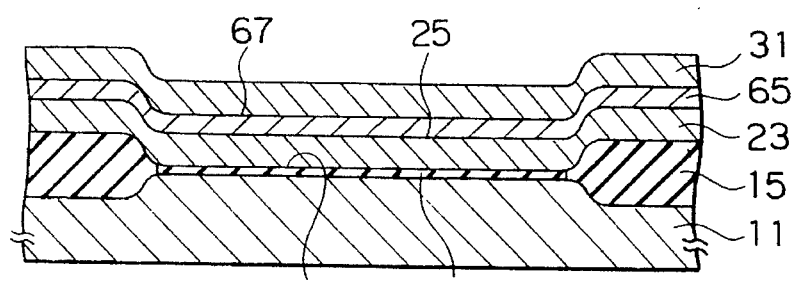

In FIG. 3(b), a first titanium silicide nitride layer 65 is formed on the first upper surface 25 having a fourth upper surface 67 by using a sputtering method which uses titanium silicide alloy comprising TiSix (x=2 to 3). The sputtering method is carried out under a flow rate of 0.1 to 0.2 between nitrogen and argon, a pressure of 0.27 to 0.67 Pa, an electric power of 1 to 4 KW, and a temperature of 25° to 500° C. in a chamber. The first titanium silicide nitride layer 65 has a thickness of 50 nm. The titanium silicide layer 31 is formed on the fourth upper surface 67 by using the sputtering method which uses titanium silicide alloy. The sputtering method is carried out under an argon atmosphere, a pressure of 0.27 to 0.67 Pa, an electric power of 1 to 4 KW, and a temperature of 25° to 500° C. in the same chamber. The titanium silicide layer 31 has a thickness of 50 nm.

Figure 3C:
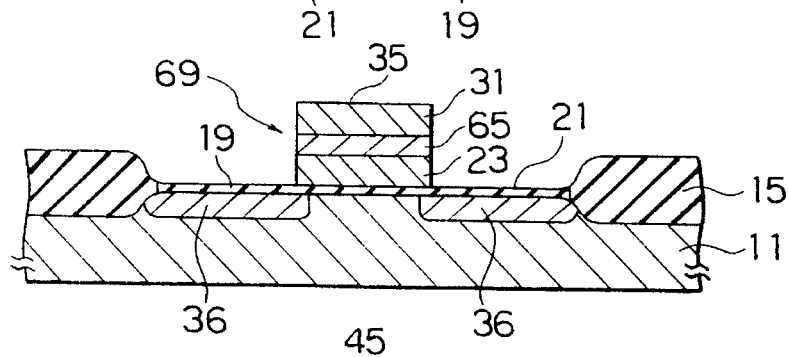

In FIG. 3(c), a gate electrode 69 is formed on the second insulator surface 21 having the third upper surface 5 leaving the surrounding area of the second insulator surface 21 by using photo-lithography and dry-etching. The method of dry-etching uses gas of HBr and BCl. The gate electrode 69 has the polycrystal silicon layer 23, the first titanium silicide nitride layer 65, and the titanium silicide layer 31. The first titanium silicide nitride layer 65 serves to prevent diffusion of phosphorus particles between the polycrystal silicon layer 23 and the titanium silicide layer 31. The titanium silicide layer 31 serves to lower resistance of the gate electrode 69. The impurity diffusion layer 36 is formed in the surface part of the semiconductor substrate 11 by injecting ions.

Figure 3D:
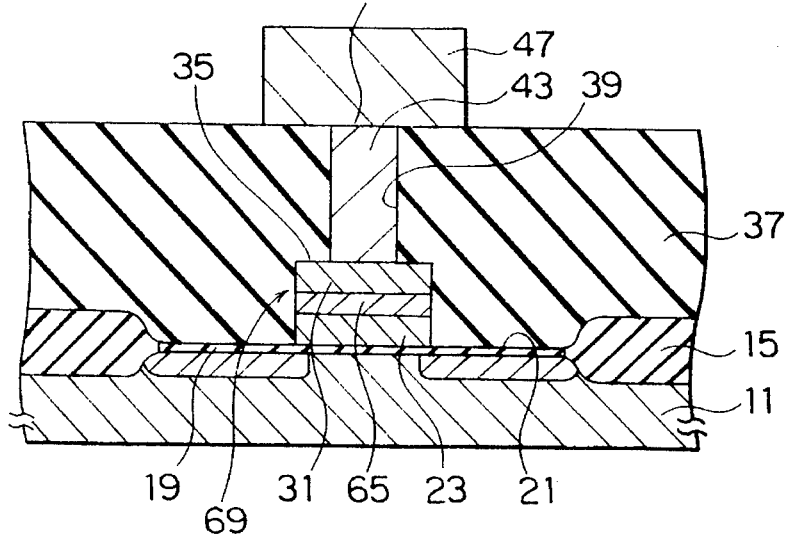

In FIG. 3(d), the third insulator layer 37 is formed on the first and the second upper insulator surfaces 17 and 21 and the third upper surface 35 of the gate electrode 69 having the second recessed surface 39 which defines the first contact hole exposing the second predetermined area of the third upper surface 35. The third insulator layer 37 has the third upper surface 41. The first contact hole is formed by etching. The tungsten plug 43 is formed on the second predetermined area of the third upper surface 35. The tungsten plug 43 has the upper plug surface 45. The upper line conductor 47 is formed on the upper plug surface 45 and a part of the third upper insulator surface 41.

Referring to FIGS. 4(a) to (d), the description will proceed to a method of manufacturing a semiconductor device according to a second embodiment of this invention. Similar parts are designated by like reference numerals.

Figure 4A:
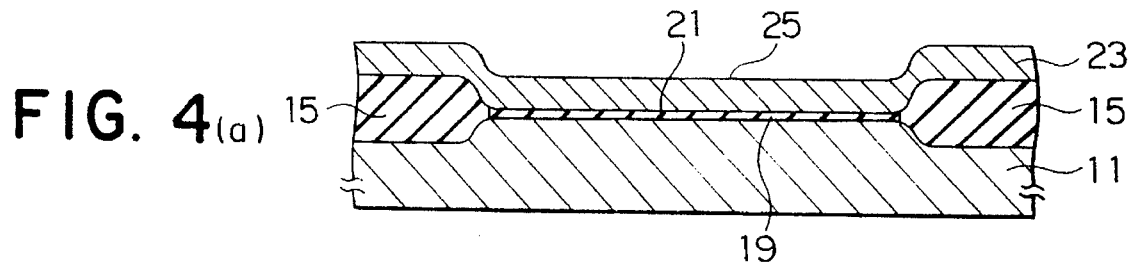
FIGS. 4(a) to 4(d) are schematic vertical sectional views for explaining a method of manufacturing a semiconductor device according to a second embodiment of this invention.

In FIG. 4(a), the semiconductor substrate 11 is prepared in the known manner. The first insulator layer 15, the second insulator layer 19, and the polycrystal silicon layer 23 are formed in the manner illustrated in FIG. 3(a).

Figure 4B:
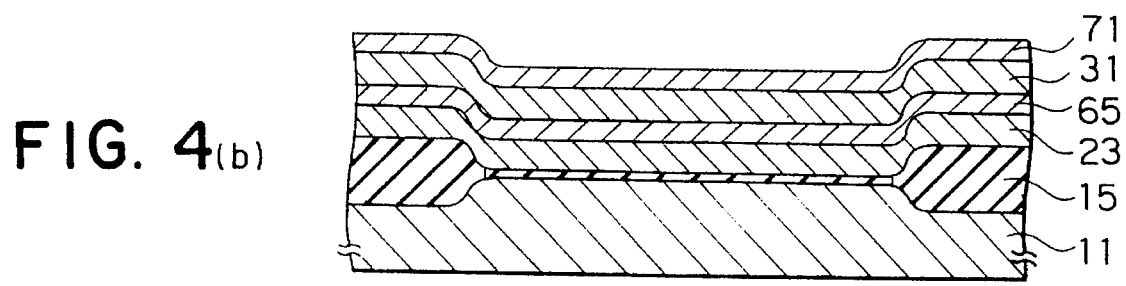

In FIG. 4(b), the first titanium silicide nitride layer 65 and the titanium silicide layer 31 are formed in the manner illustrated in FIG. 3(b). A second titanium silicide nitride layer 71 is formed on the titanium silicide layer 31 in the manner illustrated in FIG. 3(b).

Figure 4C:
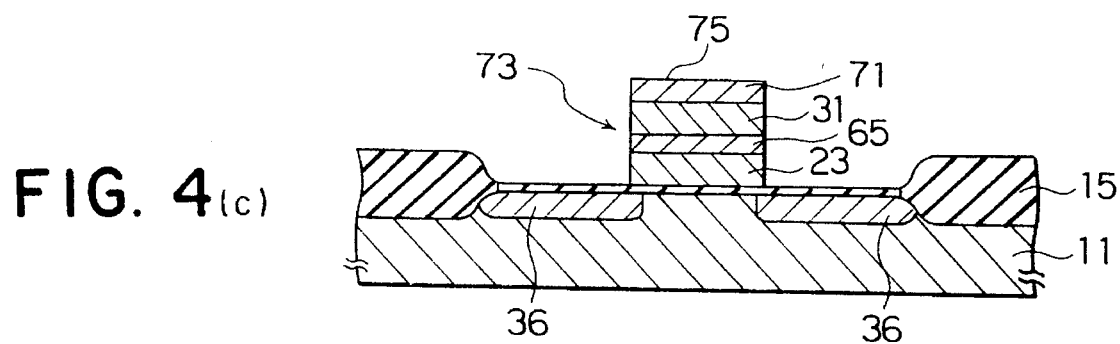

In FIG. 4(c), a gate electrode 73 is formed on the second insulator surface 21 having a fourth upper surface 75 leaving the surrounding area of the second insulator surface 21 in the manner illustrated in FIG. 3(c). The impurity diffusion layer 36 is formed in the manner illustrated in FIG. 3(c).

Figure 4D:
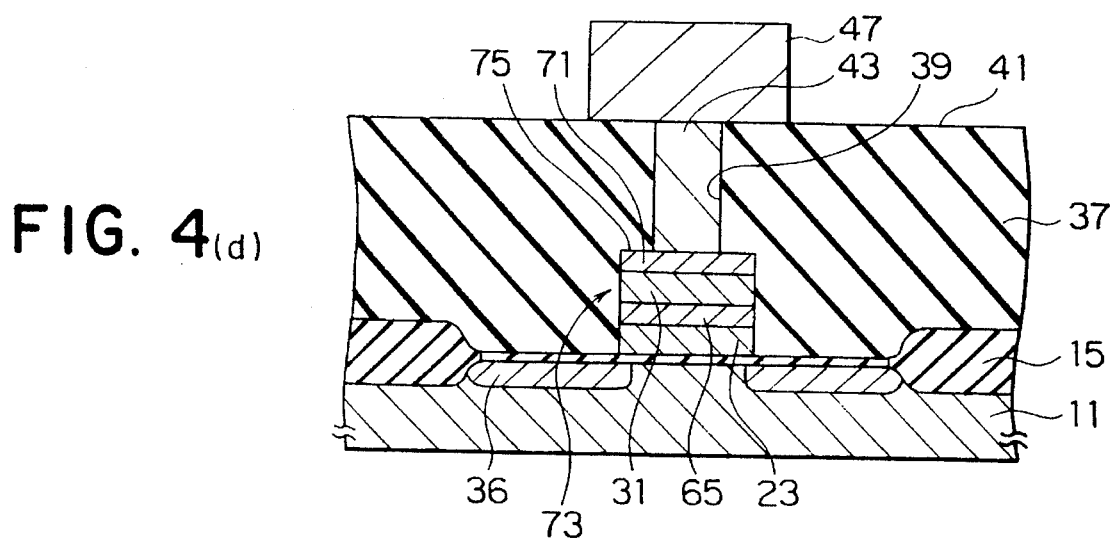

In FIG. 4(d), the third insulator layer 37, the second recessed surface 39, the tungsten plug 43, and the upper line conductor 47 were formed in the manner illustrated in FIG. 3(d).

Figure 5A:
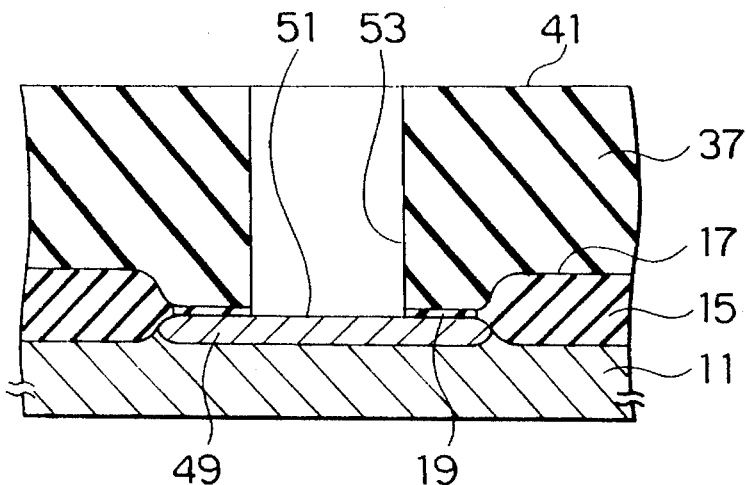
FIGS. 5(a) to 5(c) are schematic vertical sectional views for explaining a method of manufacturing a semiconductor device according to a third embodiment of this invention.
Figure 5B:
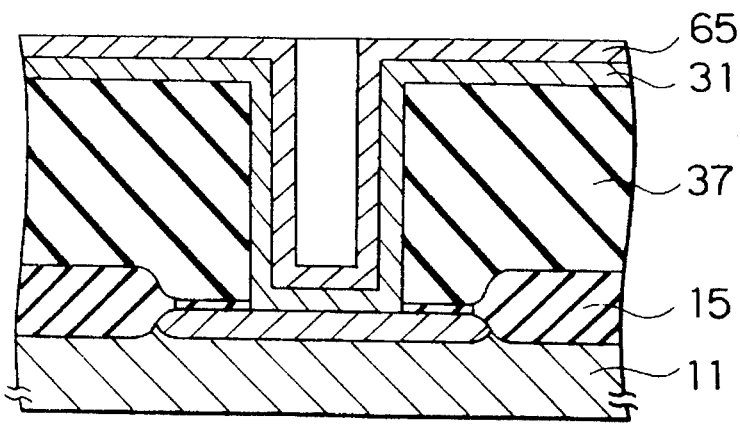
Figure 5C:
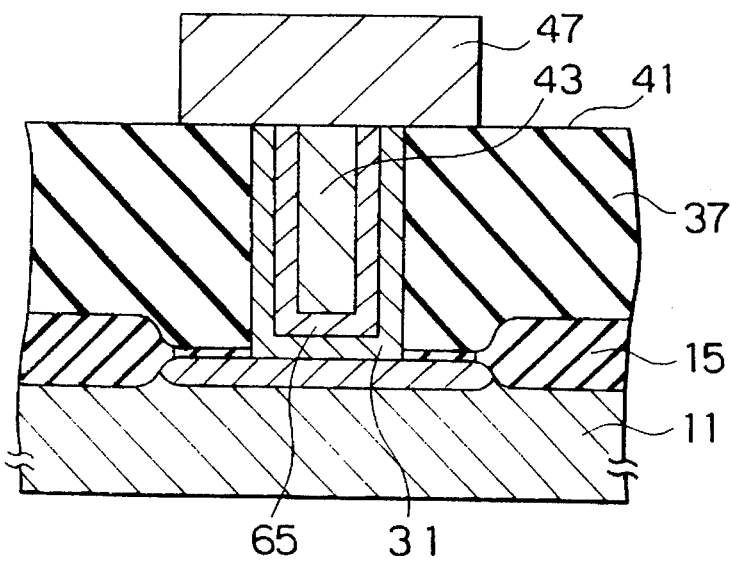

Referring to FIGS. 5(a) to (c), the description will proceed to a method of manufacturing a semiconductor device according to a third embodiment of this invention. Similar parts are designated by like reference numerals.

In FIG. 5(a), the semiconductor substrate 11 was prepared in the known manner. The first insulator layer 15, the second insulator layer 19, the impurity diffusion layer 49, the third insulator layer 37, and the second recessed surface 53 are formed in the manner illustrated in FIG. 2(a). In FIG. 5(b), the titanium silicide layer 31 is formed in the manner illustrated in FIG. 2(b). The first titanium silicide nitride layer 65 is formed in the manner illustrated in FIG. 3(b). In FIG. 5(c), the tungsten plug 43 and the upper line conductor 47 was formed in the manner illustrated in FIG. 2(c). The first titanium nitride silicide layer 65 is not easily oxidized.

What is claimed is:

1. A method of manufacturing a semiconductor device, comprising the steps of:

preparing a semiconductor substrate having a principal surface;

forming an insulator layer on said principal surface so as to have an upper insulator surface;

forming a polycrystal silicon layer on said upper insulator surface so as to have a first upper surface leaving a surrounding area of said upper insulator surface, said polycrystal silicon layer having impurities which are doped in said polycrystal silicon layer;

forming, by sputtering in an atmosphere comprising nitrogen, a titanium silicide nitride layer on said first upper surface so as to have a second upper surface; and forming a titanium silicide layer on said second upper surface.

2. A method of manufacturing a semiconductor device, comprising the steps of:

preparing a semiconductor substrate having a principal surface;

forming an insulator layer on said principal surface so as to have an upper insulator surface:

forming a polycrystal silicon layer on said upper insulator surface so as to have a first upper surface leaving a surrounding area of said upper insulator surface, said polycrystal silicon layer having impurities which are doped in said polycrystal silicon layer;

forming a first titanium silicide nitride layer on said first upper surface so as to have a second upper surface;

forming a titanium silicide layer on said second upper surface so as to have a third upper surface; and forming a second titanium silicide nitride layer on said third surface.

3. A method of manufacturing a semiconductor device, comprising the steps of:

preparing a semiconductor substrate having a principal surface;

forming a first insulator layer on said principal surface so as to have a first upper insulator surface;

forming an impurity diffusion layer in a surface part of said semiconductor substrate so as to have impurities in said impurity diffusion layer which has an impurity diffusion surface;

forming a second insulator layer on said first upper insulator surface so as to have a second upper insulator surface;

forming, in said first and said second insulator layers, a recessed surface which defines a contact hole exposing an area of said impurity diffusion surface;

forming a titanium silicide layer on said area and said recessed surface so as a first upper surface; and forming, by sputtering in an atmosphere comprising nitrogen, a titanium silicide nitride layer on said first upper surface.

* * * * *